United States Patent
Kim et al.

(10) Patent No.: US 6,927,178 B2
(45) Date of Patent: Aug. 9, 2005

(54) NITROGEN-FREE DIELECTRIC ANTI-REFLECTIVE COATING AND HARDMASK

(75) Inventors: Bok Hoen Kim, San Jose, CA (US); Sudha Rathi, San Jose, CA (US); Sang H. Ahn, Foster City, CA (US); Christopher D. Bencher, San Jose, CA (US); Yuxiang May Wang, Palo alto, CA (US); Hichem M'Saad, Santa clara, CA (US); Mario D. Silvetti, Morgan Hill, CA (US); Miguel Fung, Redwood City, CA (US); Keebum Jung, Gilroy, CA (US); Lei Zhu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 10/732,904

(22) Filed: Dec. 10, 2003

(65) Prior Publication Data

US 2004/0214446 A1 Oct. 28, 2004

Related U.S. Application Data

(63) Continuation-in-part of application No. 10/193,489, filed on Jul. 11, 2002.
(60) Provisional application No. 60/433,445, filed on Dec. 13, 2002, and provisional application No. 60/526,259, filed on Dec. 1, 2003.

(51) Int. Cl.$^7$ .................... H01L 21/31; H01L 21/469
(52) U.S. Cl. .................. 438/778; 438/790; 438/952
(58) Field of Search .................... 438/478, 760, 438/761, 765, 769, 770, 778, 790, 935, 952

(56) References Cited

U.S. PATENT DOCUMENTS

| 4,486,286 A | 12/1984 | Lewin et al. |
| 4,900,857 A | * 2/1990 | Klett .................... 556/405 |
| 5,186,718 A | 2/1993 | Tepman et al. |

(Continued)

FOREIGN PATENT DOCUMENTS

| DE | 196 54 737 A1 | 7/1997 |
| DE | 198 04 375 A1 | 1/1999 |

(Continued)

OTHER PUBLICATIONS

Robles, et al. *Characterization of High Density Plasma Chemical Vapor Deposited x–Carbon and x–Fluorinated Carbon Films for Ultra Low Dielectric Application*, Feb. 10–11, 1997 DUMIC Conference, pp. 26–33.

Bar–lian, et al. *A Comparative Study of Sub–Micro Gap Filling and Planarization Techniques*, Tower Semiconductor Ltd., Israel, SPIE vol. 2636, pp. 277–288.

(Continued)

*Primary Examiner*—Phuc T. Dang
(74) *Attorney, Agent, or Firm*—Moser, Patterson & Sheridan

(57) ABSTRACT

Methods are provided for depositing a dielectric material. The dielectric material may be used for an anti-reflective coating or as a hardmask. In one aspect, a method is provided for processing a substrate including introducing a processing gas comprising a silane-based compound and an oxygen and carbon containing compound to the processing chamber and reacting the processing gas to deposit a nitrogen-free dielectric material on the substrate. The dielectric material comprises silicon and oxygen. In another aspect, the dielectric material forms one or both layers in a dual layer anti-reflective coating.

20 Claims, 9 Drawing Sheets

U.S. PATENT DOCUMENTS

| | | | |
|---|---|---|---|
| 5,298,587 A | 3/1994 | Hu et al. | |
| 5,360,491 A | 11/1994 | Carey et al. | |
| 5,494,712 A | 2/1996 | Hu et al. | |
| 5,559,367 A | 9/1996 | Cohen et al. | |
| 5,591,566 A | 1/1997 | Ogawa | |
| 5,593,741 A | 1/1997 | Ikeda | |
| 5,598,027 A | 1/1997 | Matsuura | |
| 5,599,740 A | 2/1997 | Jang et al. | |
| 5,616,369 A | 4/1997 | Williams et al. | |
| 5,618,619 A | 4/1997 | Petrmichl et al. | |
| 5,637,351 A | 6/1997 | O'Neal et al. | |
| 5,638,251 A | 6/1997 | Goel et al. | |
| 5,641,607 A | 6/1997 | Ogawa et al. | |
| 5,674,355 A | 10/1997 | Cohen et al. | |
| 5,679,269 A | 10/1997 | Cohen et al. | |
| 5,679,413 A | 10/1997 | Petrmichl et al. | |
| 5,683,940 A | 11/1997 | Yahiro | |
| 5,693,563 A | 12/1997 | Teong | |
| 5,700,720 A | 12/1997 | Hashimoto | |
| 5,703,404 A | 12/1997 | Matsuura | |
| 5,739,579 A | 4/1998 | Chiang et al. | |
| 5,750,316 A | 5/1998 | Kawamura et al. | |
| 5,753,319 A | 5/1998 | Knapp et al. | |
| 5,753,564 A | 5/1998 | Fukada | |
| 5,773,199 A | 6/1998 | Linliu et al. | |
| 5,780,874 A | 7/1998 | Kudo | |
| 5,789,319 A | 8/1998 | Havemann et al. | |
| 5,795,648 A | 8/1998 | Goel et al. | |
| 5,800,877 A | 9/1998 | Maeda et al. | |
| 5,807,785 A | 9/1998 | Ravi | |
| 5,821,168 A | 10/1998 | Jain | |
| 5,830,332 A | 11/1998 | Babich et al. | |
| 5,834,162 A | 11/1998 | Malba | |
| 5,837,331 A | 11/1998 | Menu et al. | |
| 5,858,880 A | 1/1999 | Dobson et al. | |
| 5,874,367 A | 2/1999 | Dobson | |
| 5,888,593 A | 3/1999 | Petrmichl et al. | |
| 5,891,799 A | 4/1999 | Tsui | |
| 5,926,740 A | 7/1999 | Forbes et al. | |
| 5,981,000 A | 11/1999 | Grill et al. | |
| 5,989,998 A | 11/1999 | Sugahara et al. | |
| 5,998,100 A | 12/1999 | Azuma et al. | |
| 6,007,732 A | 12/1999 | Hashimoto et al. | |
| 6,030,904 A | 2/2000 | Grill et al. | |
| 6,037,274 A | 3/2000 | Kudo et al. | |
| 6,048,786 A | 4/2000 | Kudo | |
| 6,051,321 A | 4/2000 | Lee et al. | |
| 6,054,206 A | 4/2000 | Mountsier | |
| 6,054,379 A | 4/2000 | Yau et al. | |
| 6,068,884 A | 5/2000 | Rose et al. | |
| 6,072,227 A | 6/2000 | Yau et al. | |
| 6,078,133 A | 6/2000 | Menu et al. | |
| 6,080,526 A | 6/2000 | Yang et al. | |
| 6,093,973 A | 7/2000 | Ngo et al. | |
| 6,124,641 A | 9/2000 | Matsura | |
| 6,140,226 A | 10/2000 | Grill et al. | |
| 6,147,009 A | 11/2000 | Grill et al. | |
| 6,147,407 A | 11/2000 | Jin et al. | |
| 6,156,674 A | 12/2000 | Li et al. | |
| 6,159,871 A | 12/2000 | Loboda et al. | |
| 6,176,198 B1 | 1/2001 | Kao et al. | |
| 6,238,751 B1 | 5/2001 | Mountsier | |
| 6,245,690 B1 | 6/2001 | Yau et al. | |
| 6,252,295 B1 | 6/2001 | Levine et al. | |
| 6,258,735 B1 | 7/2001 | Xia et al. | |
| 6,265,779 B1 | 7/2001 | Grill et al. | |
| 6,287,990 B1 | 9/2001 | Cheung et al. | |
| 6,303,523 B2 | 10/2001 | Cheung et al. | |
| 6,312,793 B1 | 11/2001 | Grill et al. | |
| 6,316,063 B1 | 11/2001 | Andideh et al. | |
| 6,340,435 B1 | 1/2002 | Bjorkman et al. | |
| 6,340,628 B1 | 1/2002 | Van Cleemput et al. | |
| 6,346,747 B1 | 2/2002 | Grill et al. | |
| 6,348,421 B1 | 2/2002 | Shu et al. | |
| 6,348,725 B2 | 2/2002 | Cheung et al. | |
| 6,368,924 B1 | 4/2002 | Mancini et al. | |
| 6,383,955 B1 | 5/2002 | Matsuki et al. | |
| 6,410,462 B1 | 6/2002 | Yang et al. | |
| 6,410,463 B1 | 6/2002 | Matsuki | |
| 6,413,583 B1 | 7/2002 | Moghadam et al. | |
| 6,413,852 B1 | 7/2002 | Grill et al. | |
| 6,417,098 B1 | 7/2002 | Wong et al. | |
| 6,428,894 B1 | 8/2002 | Babich et al. | |
| 6,432,417 B1 | 8/2002 | Mellul et al. | |
| 6,437,443 B1 | 8/2002 | Grill et al. | |
| 6,441,491 B1 | 8/2002 | Grill et al. | |
| 6,448,176 B1 | 9/2002 | Grill et al. | |
| 6,448,186 B1 | 9/2002 | Olson et al. | |
| 6,455,445 B2 | 9/2002 | Matsuki | |
| 6,458,720 B1 | 10/2002 | Aoi | |
| 6,462,371 B1 | 10/2002 | Weimer et al. | |
| 6,472,231 B1 | 10/2002 | Gabriel et al. | |
| 6,472,264 B1 | 10/2002 | Agarwal | |
| 6,472,317 B1 | 10/2002 | Wang et al. | |
| 6,479,110 B2 | 11/2002 | Grill et al. | |
| 6,479,407 B2 | 11/2002 | Yokoyama et al. | |
| 6,479,408 B2 | 11/2002 | Shioya et al. | |
| 6,479,409 B2 | 11/2002 | Shioya et al. | |
| 6,482,754 B1 | 11/2002 | Andideh et al. | |
| 6,485,815 B1 | 11/2002 | Jeong et al. | |
| 6,489,233 B2 | 12/2002 | Chooi et al. | |
| 6,492,731 B1 | 12/2002 | Catabay et al. | |
| 6,497,963 B1 | 12/2002 | Grill et al. | |
| 6,500,772 B2 | 12/2002 | Chakravarti et al. | |
| 6,500,773 B1 | 12/2002 | Gaillard et al. | |
| 6,511,903 B1 | 1/2003 | Yau et al. | |
| 6,511,909 B1 | 1/2003 | Yau et al. | |
| 6,514,667 B2 | 2/2003 | Angelopoulos et al. | |
| 6,541,397 B1 | 4/2003 | Bencher | |
| 6,573,030 B1 | 6/2003 | Fairbairn et al. | |
| 6,596,465 B1 | 7/2003 | Mangat et al. | |
| 6,613,682 B1 * | 9/2003 | Jain et al. | 438/706 |
| 6,720,251 B1 | 4/2004 | van Schravendijk et al. | |
| 2001/0004479 A1 | 6/2001 | Cheung et al. | |
| 2001/0005546 A1 | 6/2001 | Cheung et al. | |
| 2001/0021590 A1 | 9/2001 | Matsuki | |
| 2001/0022398 A1 | 9/2001 | Grill et al. | |
| 2002/0028392 A1 | 3/2002 | Jin et al. | |
| 2002/0055672 A1 | 5/2002 | Zhang | |
| 2002/0068458 A1 | 6/2002 | Chiang et al. | |
| 2002/0076944 A1 | 6/2002 | Wang et al. | |
| 2002/0098684 A1 | 7/2002 | Li et al. | |
| 2002/0098714 A1 | 7/2002 | Grill et al. | |
| 2002/0105084 A1 | 8/2002 | Li | |
| 2002/0127844 A1 | 9/2002 | Grill et al. | |
| 2002/0158337 A1 | 10/2002 | Babich et al. | |
| 2002/0160604 A1 | 10/2002 | Quek et al. | |
| 2002/0160626 A1 | 10/2002 | Matsuki et al. | |
| 2002/0164868 A1 | 11/2002 | Chang et al. | |
| 2002/0164891 A1 | 11/2002 | Gates et al. | |
| 2002/0168870 A1 | 11/2002 | Matsuki | |
| 2002/0172766 A1 | 11/2002 | Laxman et al. | |
| 2002/0173157 A1 | 11/2002 | Chang et al. | |
| 2002/0173172 A1 | 11/2002 | Loboda et al. | |
| 2002/0177303 A1 | 11/2002 | Jiang et al. | |
| 2002/0177329 A1 | 11/2002 | Yang et al. | |
| 2002/0185741 A1 | 12/2002 | Babich et al. | |
| 2002/0192982 A1 | 12/2002 | Andideh et al. | |
| 2002/0198353 A1 | 12/2002 | Chen et al. | |
| 2003/0001239 A1 | 1/2003 | Gallahger et al. | |
| 2003/0003765 A1 | 1/2003 | Gibson, Jr. et al. | |

| | | | |
|---|---|---|---|
| 2003/0017718 | A1 | 1/2003 | Aoi |
| 2003/0064154 | A1 | 4/2003 | Laxman et al. |
| 2003/0020108 | A1 | 5/2003 | Matsuura |
| 2003/0089988 | A1 | 5/2003 | Matsuura |
| 2003/0091938 | A1 | 5/2003 | Fairbaim et al |
| 2003/0111730 | A1 | 6/2003 | Takeda et al. |

FOREIGN PATENT DOCUMENTS

| | | |
|---|---|---|
| DE | 199 04 311 A1 | 8/1999 |
| EP | 0 224 013 | 6/1987 |
| EP | 0 696 819 A1 | 2/1996 |
| EP | 0 701 283 A2 | 3/1996 |
| EP | 0 768 388 A2 | 4/1997 |
| EP | 0 771 886 A1 | 5/1997 |
| EP | 0 774 533 A1 | 5/1997 |
| EP | 0 826 791 A2 | 3/1998 |
| EP | 0 840 365 A2 | 6/1998 |
| EP | 0 849 789 A2 | 6/1998 |
| EP | 0 885 983 A1 | 12/1998 |
| EP | 0 926 715 A2 | 6/1999 |
| EP | 0 926 724 A2 | 6/1999 |
| EP | 0 935 283 A2 | 8/1999 |
| EP | 0 960 958 A2 | 12/1999 |
| EP | 1 037 275 A1 | 9/2000 |
| EP | 1 061 156 A2 | 12/2000 |
| EP | 1 123 991 A2 | 8/2001 |
| EP | 1 176 226 A1 | 1/2002 |
| EP | 1 209 728 A2 | 5/2002 |
| GB | 2 316 535 | 2/1998 |
| JP | 01-125193 | 5/1989 |
| JP | 09-008031 | 1/1997 |
| JP | 09-064029 | 3/1997 |
| JP | 09-237785 | 9/1997 |
| JP | 09-251997 | 9/1997 |
| JP | 09-260369 | 10/1997 |
| JP | 10-242143 | 9/1998 |
| JP | 11-251293 | 9/1999 |
| JP | 200306999 | 11/2000 |
| WO | 98/08249 | 2/1998 |
| WO | 98/59089 | 12/1998 |
| WO | 99/33102 | 7/1999 |
| WO | 99/38202 | 7/1999 |
| WO | 99/41423 | 8/1999 |
| WO | 99/55526 | 11/1999 |
| WO | 00/01012 | 1/2000 |
| WO | 00/19498 | 4/2000 |
| WO | 00/24050 | 4/2000 |
| WO | 01/01472 | 1/2001 |
| WO | 02/43119 | 5/2002 |

OTHER PUBLICATIONS

Hazari, et al., *Characterization of Alternative Chemistries for Depositing PECVD Silicon Dioxide Films, Novellus Systems, Inc.,* San Jose, CA Feb. 16–17, 1998, pp. 319–326.

McClatchie, *Low Dielectric Constant Oxide Films Deposited Using CVD Techniques,* Feb. 16–17, 1998 DUMIC Conference, pp. 311–318.

Reif, et al., *Environmental, Safety, and Health Issues in IC Production,* Mat. Res. Soc. Symposium Proceedings vol. 447, Dec. 4–5, 1996 (6 pages).

Laboda, et al., *Deposition of Low–k Dielectric Films Using Trimethylsilane,* Electro. Chem. Soc., vol. 98–6, pp. 145–152.

Zhao, et al., *Integration of Low Dielectric Constant Materials in Advanced Aluminum and Copper Interconnects,* Conexant Systems, 1999 pp. 485–497.

Sugahara, et al., *Low Dielectric Constant Carbon Containing $SiO_2$ Films Deposited by PECVD Technique Using a Novel CVD Precursor,* Feb. 10–11, 1997 DUMIC Conference, pp. 19–25.

Nara, et al., *Low Dielectric Constant Insulator Formed by Downstream Plasma CVD at Room Temperature Using $TMS/O_2$,* ULSI Research Lab, Nov. 14, 1996, pp. 1477–1480.

Deen, et al. *Silicon Nitride and Silicon Dioxide Thin Insulating Films,* Dielectric Science and Tech and Electronics Div. Proceedings, vol. 97–10, pp. 443–453.

Brown, *Dielectric Material Integration for Microelectronics,* Dielectric Science and Technology and Elect Divisions Proceedings, vol. 98–3 (8 pages).

Grill, et al., *Novel Low–k Dielectrics Based on Diamondlike Carbon Materials,* IBM Research Division, pp. 1649–1653.

Lin, et al., *Plasma Polymerization of Trimethylsilane in Cascade Arc Discharge,* Dept. of Chem. Engineering and Center for Surface Science and Plasma Technology, University of Missouri–Columbia, Feb. 4, 1997, pp. 1653–1665.

Peters, *Pursuing the Perfect Low–K Dielectric,* 64 Semiconductor International, Sep. 1998, (7 pages).

Grill, et al., *Low Dielectric Constant Films Prepared by Plasma–enhanced Chemical Vapor Deposition from Tetramethylsilane,* IBM Research Division, pp. 3314–3318.

Wrobel, et al. *Reactivity of Alkylsilanes and Alkylcarbosilanes in Atomic Hydrogen–induced Chemical Vapor Deposition,* Polish Academy of Sciences, Centre of Molecular and Macromolecular Studies, pp. 1060–1065.

Mahorowala, et al., *Tunable Anti–Reflective Coatings with Built–in Hard Mask Properties Facilitating Thin Resist Processing,* Proceedings of SPIE, vol. 4343 (2001) pp. 306–316.

Singer (editor), *Anti–Reflective Coatings: A Story of Interfaces,* Semiconductor International, Mar. 1999.

Taylor, et al., *Parylene Copolymers,* Texas Instruments, Inc., 1997, pp. 1–9.

Grill, et al., *Diamondlike Carbon Materials as Low–k Dielectrics,* Mat. Res. Soc., 1997, pp. 417–423.

Wu, et al "*Advanced Metal Barrier Free Cu Damascene Interconnects with PECVD Silicon Carbide Barriers for 90/65–nm BEOL Tech*", 2002 IEEE, IEDM P 595–598.

Licata, et al. *Dual Damascene Al Wiring For 256M DRAM;* Jun. 27–29, 1995 VMIC Conference, 1995 ISMIC—104/95/0596.

Endo, Kazuhiko; and Tatsumi, Toru, "*Preparation and Properties of Fluorinated Amorphous Carbon Thin Films by Plasma Enhanced Chemical Vapor Deposition*", Mat. Res. Soc. Symp. Proc. vol. 381, 1995.

Nguyen, et al. "*A Novel Damascene Process for One Mask Via/Interconnect Formation*", 1996 Symposium on VLSI Tech Digest of Technical Papers.

Lakshminarayanan, et al., "*Contact and Via Structures with Coper Interconnects Fabricated Using Dual Damascene Technology*", IEEE Electron Device Letters, vol. 15, No. 8, Aug. 1994.

Grill, et al. "*Diamondlike Carbon Films by rf plalsma assisted chemical vapor deposition from acetylene*", IBM J. Res. Dev. vol. 34 No. 6 Nov. 1990.

Kaanta, et al., "*Dual Damascene: A ULSI Wiring Technology*", Jun. 11–12, 1991 VMIC Conference, TH–0359–0/91/0000–0144.

Hasegawa, et al. "*Copper Dual Damascene Interconnects with Low–K ($K_{eff}$<3,0) Dielectrics Using Flare$^{th}$ and an Organo–Silicate Hard Mask*", LSI Business & Technology Development Group, C.N.C. Sony Corporation; IEDM 99–623; pp. 26.4.1–26.4.4.

U.S. Appl. No. 10/375,852 filed Feb. 25, 2003.(AMAT/ 2592.C5).

U.S. Appl. No. 10/196,498 filed Jul. 15, 2002 (AMAT/ 6084).

U.S. Appl. No. 10/247,404 filed Jun. 19, 2002 (AMAT/ 6084.P1).

U.S. Appl. No. 10/096,503 filed Mar. 12, 2002 (AMAT/ 6084.02).

U.S. Appl. No. 09/627,667 filed Jul. 28, 2000.(AMAT/ 4683).

U.S. Appl. No. 10/122,106 filed Apr. 11, 2002. (AMAT/ 6166).

PCT International Search Report PCT/US 03/39270, dated May 3, 2004 (AMAT/6826.PC.02).

* cited by examiner

NITROGEN-FREE DIELECTRIC ANTI-REFLECTIVE COATING AND HARDMASK

This application claims priority to U.S. Provisional Application No. 60/433,445, filed Dec. 13, 2002 and U.S. Provisional Application No. 60/526,259 filed Dec. 1, 2003 titled "Nitrogen-Free Dielectric Antireflective Coating and Hardmask," and is a continuation in part of U.S. patent application Ser. No. 10/193,489 filed Jul. 11, 2002.

BACKGROUND OF THE DISCLOSURE

1. Field of the Invention

The invention relates to the fabrication of integrated circuits and to a process for depositing dielectric layers on a substrate and the structures formed by the dielectric layers.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional CVD processes supply reactive gases to the substrate surface where heat-induced or energy-enhanced chemical reactions take place to produce a desired layer.

Semiconductor device geometries have dramatically decreased in size since the devices were first introduced several decades ago. Since then, the number of devices that will fit on a chip doubles every two years. Tomorrow's plants soon will be producing devices with smaller geometries.

To further reduce the size of devices on integrated circuits, the industry is using conductive materials having low resistivity and insulators having low dielectric constants (dielectric constants of less than 4.0) to reduce the capacitive coupling between adjacent metal lines. One such low dielectric constant (low k) material comprises silicon, oxygen, and carbon and may be deposited as a dielectric material in fabricating damascene features. One conductive material having a low resistivity is copper and its alloys, which have become the material of choice for sub-quarter-micron interconnect technology because copper has a lower resistivity than aluminum, (1.7 $\mu\Omega$-cm compared to 3.1 $\mu\Omega$-cm for aluminum), a higher current and higher carrying capacity. These characteristics are important for supporting the higher current densities experienced at high levels of integration and increased device speed. Further, copper has desirable thermal conductivity and is available in a highly pure state.

Unfortunately, copper is difficult to etch and achieve a precise pattern. Etching with copper using traditional deposition and etch processes for forming interconnects has been less than satisfactory. Thus, new methods for manufacturing interconnects containing copper and low k dielectric materials are being developed.

One method for forming vertical and horizontal interconnects is by using damascene or dual damascene method. In the damascene method, one or more dielectric materials, including low k dielectric materials, are deposited and pattern etched to form the vertical interconnects (vias) and horizontal interconnects (lines). Conductive materials such as copper and barrier layer materials used to prevent diffusion of copper into the surrounding low k dielectric are then inlaid into the etched pattern. Any excess copper and barrier layer materials external to the etched pattern remaining on the field of the substrate are then removed.

However, low k dielectric materials are often porous and susceptible to interlayer diffusion of conductive materials which can result in the formation of short-circuits and device failure. A dielectric barrier layer material is used in copper damascene structures to reduce or to prevent interlayer diffusion. Traditional dielectric barrier layer materials often have high dielectric constants of 7 or greater. The combination of a high k dielectric material with surrounding low k dielectric materials results in dielectric stacks having a higher than desired dielectric constant.

Additionally, forming damascene structures requires the use of lithographic processes. For example, in process sequences using conventional lithographic techniques, a layer of energy sensitive resist is formed over a stack of material layers on a substrate. Many of the underlying material layers are reflective to ultraviolet light. These reflections can distort the dimensions of features such as lines and vias that are formed in the energy sensitive resist material. This is troublesome when using 193 nm radiation with reflective metal layers. One technique proposed to minimize reflections from an underlying material layer uses an anti-reflective coating (ARC). The ARC is formed over the reflective material layer prior to resist patterning. The ARC suppresses the reflections of the underlying material layer during resist imaging, providing accurate pattern replication in the layer of energy sensitive resist.

However, conventional ARC materials contain nitrogen, including silicon nitride and titanium nitride. Nitrogen in the ARC layer may chemically alter the composition of the photoresist material. The chemical reaction between nitrogen and the photoresist material is referred to as photoresist poisoning. The altered photoresist material may not be lithographically patterned as expected and result in imprecisely formed features in the photoresist material or excessive photoresist residue remaining on the substrate surface after photoresist patterning, both of which can detrimentally affect subsequent processes, such as etching processes. For example, nitrogen may neutralize acid near a photoresist and ARC interface and result in residue formation, known as footing, which can further result in curved or rounded aspects at the interface of the bottoms and sidewalls of features rather than desired right angles.

Additionally, low k materials are susceptible to surface defects or feature deformation during polishing and removal of conductive materials under conventional polishing processes. One solution to limit or reduce surface defects and deformation is to deposit a hardmask over the exposed low k materials prior to patterning and etching feature definitions in the low k materials. The hardmask is resistant to damage and deformation. The hardmask also protects the underlying low k materials during subsequent material deposition and planarization or material removal processes to reduce defect formation and feature deformation.

Also, conventional hardmask materials do not have sufficient selectivity to oxide or metal during polishing, which may result in premature removal of the hardmask and expose the underlying material to the process. The exposed underlying low k dielectric material may be damaged and result in surface defects and feature deformation. Additionally, hardmasks and ARC materials may remain as part of the structure after the underlying dielectric layer is etched and contribute to the structure's overall dielectric constant. Conventional hardmask materials often have high dielectric constants of 7 or greater, which can produce dielectric stacks having a higher than desired dielectric constant. Current hardmask materials have not satisfactorily produced both low k material and sufficient polishing selectivity to be used in damascene fabrication.

Hardmask and ARC material formed from conventional material may exhibit a porous surface. The small holes are referred to as pinholes. The pinholes can be formed completely through the ARC layer thereby exposing photoresist material deposited on the ARC layer to material underlying the ARC layer, such as silicon nitride. Nitrogen from silicon nitride or other nitrogen containing material may diffuse through the ARC layer and chemically alter the composition of the photoresist material and result in photoresist poisoning.

Further, as the device size shrinks to 0.13 um or below and chipmakers migrate to dual damascene process for faster and higher-level performance, new lithographic challenges arise. As the photolithographic patterning wavelength is reduced to 193 nm for forming features of 0.13 um or below, new photoresists (PR) are being developed to work in conjunction with photolithography at a wavelength of 193 nm. Amine radicals ($NH_2$) from current dielectric antireflective coatings, such as $SiO_xN_y$, neutralize the acid catalyst in 193 nm PR. Footing results because the neutralized portion of PR is insoluble in developer. The use of the shorter 193 nm wavelength also results in the substrate being more reflective, and increases the difficulty in controlling critical dimensions variations (CD swing), and effective photolithographic processing requires substrate reflectivity below 1 percentage for the shorter wavelengths.

Dual damascene process presents additional challenges for control of CD swing. For example, Al interconnect processing consists of blanket Al layer deposition, photolithography process to pattern an Al layer, and dielectric gap fill. The high reflectivity and absorption of Al layers of the DUV wavelength does not allow any DUV light to transmit through the Al layers. Thus, the various structures underlying an Al layer do not contribute to any reflection above the Al layer. In contrast, for dual damascene process, the oxide-like low k dielectric is transparent at the patterning wavelength so that the substrate reflection varies depending on the underlying structure. Additionally, anti-reflective layers require dual damascene applications to have sufficient interlayer adhesion with low k inter-metal dielectric materials (IMD). Current anti-reflective coating materials and processes have not been satisfactory in meeting these requirements.

Therefore, there remains a need for an improved process and material for forming dielectric materials suitable as anti-reflective coatings or hardmasks with a satisfactory etching selectivity for damascene applications.

SUMMARY OF THE INVENTION

Aspects of the invention generally provide a method for depositing a nitrogen-free dielectric layer for use as a hardmask or anti-reflective coating. In one aspect, the invention provides a method for processing a substrate including introducing a processing gas comprising an oxygen-free silane-based compound and an oxygen and carbon containing compound to the processing chamber and reacting the processing gas to deposit a nitrogen-free dielectric material on the substrate, wherein the dielectric material comprises silicon and oxygen.

In another aspect of the invention, a method is provided for processing a substrate including depositing at least one dielectric layer on a substrate surface, forming a hardmask layer on the at least one organic or inorganic layer, wherein the hardmask layer is deposited by a process comprising reacting a processing gas comprising an oxygen-free silane-based compound and an oxygen and carbon containing compound to deposit a nitrogen-free dielectric material on the substrate, wherein the hardmask layer comprises silicon and oxygen and has a selectivity of oxide to hardmask of about 4:1 or greater, defining a pattern in at least one region of the hardmask layer, and forming a feature definition in the at least one organic or inorganic layer by the pattern formed in the at least one region of the hardmask layer.

In another aspect of the invention, a method is provided for processing a substrate including depositing a first anti-reflective layer and depositing a second anti-reflective layer on the first anti-reflective layer, with the second anti-reflective layer deposited by a process including introducing a processing gas comprising an oxygen-free silane-based compound and an oxygen and carbon containing compound to the processing chamber and reacting the processing gas to deposit a nitrogen-free dielectric material on the substrate, wherein the nitrogen-free dielectric material comprises at least silicon and oxygen.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
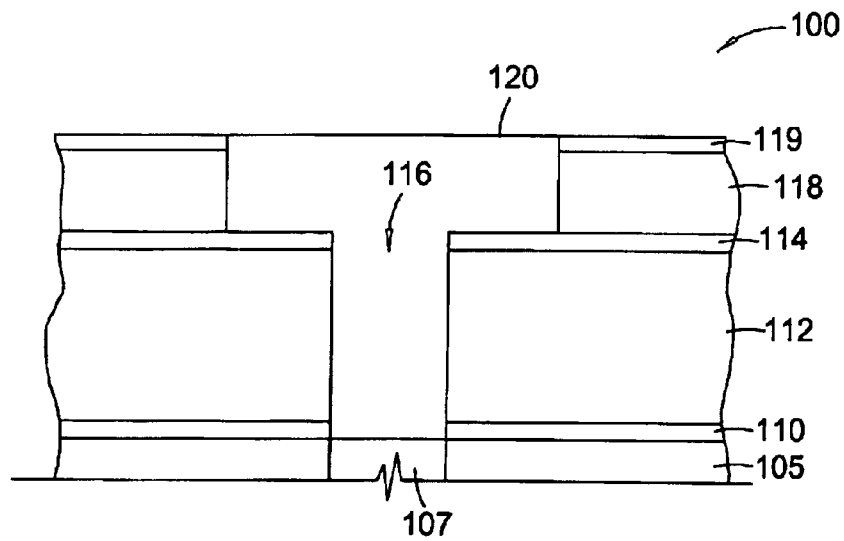
FIG. 1 is a cross sectional view showing a dual damascene structure comprising a nitrogen free anti-reflective coating as described herein.

For a further understanding of aspects of the invention, reference should be made to the ensuing detailed description.

DETAILED DESCRIPTION OF THE PREFERRED EMBODIMENTS

Aspects of the invention described herein refer to methods for depositing a nitrogen-free dielectric material. The nitrogen-free dielectric material may be used as an anti-reflective coating adjacent to a dielectric material or a hardmask dielectric layer in a metallization scheme for a damascene or dual damascene process.

In one aspect, the nitrogen-free dielectric material may be deposited by reacting a processing gas comprising a silane-based compound and an oxygen and carbon containing compound, such as carbon dioxide or an organosilicon compound. The nitrogen-free dielectric material comprises at least silicon and oxygen, and may further include carbon. The nitrogen-free dielectric material may be deposited by a plasma-enhanced chemical vapor deposition process. The deposited nitrogen-free dielectric material may exhibit a dielectric constant of about 11 or less, such as about 4 or less.

Suitable silane-based compounds for the processes described herein include oxygen-free silane-based compounds. Oxygen-free silane-based compounds may have the formula $Si_xH_{2x+2}$, $Si_xH_yCl_z$, $(CH_3)_2Si_xH_y$, or combinations thereof may be used in the deposition processes described herein, X may be equal to 1 to 4, Y may be equal to 2X+1, and Z may be equal to 1 to 2X+2. Examples of such compounds include silane, disilane, chlorosilane, dichlorodisilane, hexachlorosilane, methylsilane, dimethylsilane, trimethylsilane, tetramethylsilane, and combinations thereof. One or more of the oxygen-free silane-based compounds may be used in the deposition processes described herein. The silane-based compound, such as silane, may be supplied to a plasma processing chamber at a flow rate between about 100 sccm and about 700 sccm.

Suitable oxygen and carbon containing compounds include carbon dioxide, carbon monoxide, and organosilicon compounds that contain oxygen. Suitable organosilicon compounds that contain oxygen include tetraethoxysilane (TEOS), triethoxyfluorosilane (TEFS), 1,3,5,7-tetramethylcyclotetrasiloxane (TMCTS), dimethyldiethoxysilane, dimethyldimethoxysilane, 1,3-dimethyldisiloxane, 1,1,3,3-tetramethyldisiloxane (TMDSO), hexamethyldisiloxane (HMDS), 1,3-bis(silanomethylene)disiloxane, bis(1-methyldisiloxanyl)methane, 2,2-bis(1-methyldisiloxanyl)propane, hexamethoxydisiloxane (HMDOS), 1,3,5-trisilano-2,4,6-trimethylene, octamethylcyclotetrasiloxane (OMCTS), 1,3,5,7,9-pentamethylcyclopentasiloxane, 1,3,5,7-tetrasilano-2,6-dioxy-4,8-dimethylene, hexamethylcyclotrisiloxane, and combinations thereof.

The organosilicon compounds are used to provide a source of oxygen and carbon for the deposited nitrogen-free dielectric material. Liquid oxygen-containing organosilicon compound, such as TEOS, may be vaporized and supplied to the plasma processing chamber at a flow rate of about 2000 mgm or greater. The oxygen-free silane-based compounds and the liquid organosilicon compounds are generally supplied to the processing chamber in a flow rate ratio of the oxygen-free silane-based compound to the liquid oxygen containing organosilicon compound between about 1 (sccm): 20 (mgm) and about 6 (sccm):5 (mgm).

Other materials that may provide oxygen and carbon sources, such as carbon monoxide and carbon dioxide, may be used with the organosilicon compounds, or used as an alternative to the organosilicon compounds.

If oxygen-containing organosilicon compounds are reacted to deposit the nitrogen-free dielectric material, the nitrogen-free dielectric material has an oxygen content between about 15 atomic percentage and about 50 atomic percentage, for example, between about 15 atomic percentage and about 30 atomic percentage to have sufficient layer properties to perform an anti-reflective coating or hardmask layer. The silicon content of the deposited film may contain between about 20 atomic percentage and about 50 atomic percentage, between about 20 and about 30 atomic percentage of hydrogen, and generally less than about 15 atomic percentage of carbon. The film is generally considered a carbon-doped silicon oxide at the respective silicon, oxygen, and carbon atomic percentages described herein.

The amount of oxygen, silicon, and carbon content of the deposited film may vary. For example, increasing silane-base precursor flow rates have been observed to result in reducing the oxygen content of the deposited materials.

The processing gas may further comprise an inert gas. Inert gases, such as a noble gas selected from the group of argon, helium, neon, xenon, or krypton, and combinations thereof, may be added to the processing gas to improve processing stability. The inert gas may be provided at a flow rate between about 100 sccm and about 20,000 sccm.

The processes described herein are preferably performed in a processing chamber adapted to chemically mechanically deposit organosilicon material while applying RF power, such as a DxZ™ chemical vapor deposition chamber or the Producer™ deposition chamber, both of which are commercially available from Applied Materials, Inc., Santa Clara, Calif. An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

A nitrogen-free dielectric material may be deposited in one embodiment by supplying the silane-based compound, such as silane, to a plasma processing chamber at a flow rate between about 100 sccm and about 700 sccm, supplying the oxygen-containing organosilicon compound, such as TEOS, to the plasma processing chamber at a flow rate of about 2000 mgm or greater, supplying a noble gas at a flow rate between about 100 sccm and about 20,000 sccm, maintaining a substrate temperature between about 100° C. and about 1000° C., maintaining a chamber pressure below about 50 Torr and an RF power of between about 0.16 watts/cm² and about 32 watts/cm², or a power level between about 50 watts and about 10,000 watts for a 200 mm substrate. The substrate is maintained at a distance between about 0.1 cm and about 10 cm from the source of the processing gas.

The RF power can be provided at a frequency between about 1 kHz and about 10 GHz. In one aspect, the RF power can be provided at a high frequency such as between about 13 MHz and about 14 MHz or a mixed frequency of the high frequency and the low frequency, for example, a high frequency of about 13.56 MHz and a low frequency of about 356 KHz. The RF power can be provided continuously or in short duration cycles wherein the power is on at the stated levels for cycles less than about 200 Hz and the on cycles total between about 10 percentage and about 30 percentage of the total duty cycle. The processing gas may be introduced into the chamber by a gas distributor, the gas distributor may be positioned between about 200 mils and about 700 mils from the substrate surface. The following chart provides embodiments for use with 200 and 300 mm substrates. The high k DARC deposition is followed by low k DARC deposition.

TABLE 1

Processing Conditions for High and Low k Layer Deposition.

| | 200 mm | | | 300 mm | | |
|---|---|---|---|---|---|---|
| | Low k | High k | Range | Low k | High k | Range |
| SiH4, sccms | 95 | 109 | 50–150 | 198 | 255 | 100–350 |
| CO2, sccms | 4500 | 700 | 300–7000 | 9000 | 3000 | 500–14000 |
| He, sccms | 0 | 3500 | 0–7000 | 0 | 5000 | 0–10000 |
| T, ° C. | 350 | 350 | 250–550 | 350 | 350 | 250–550 |
| P, Torr | 6 | 5.5 | 4.5–8 | 6 | 5.5 | 4.5–8 |
| Spacing, mils | 530 | 485 | 230–600 | 520 | 510 | 230–600 |
| 13.56 MHz RF, W | 125 | 210 | 50–400 | 245 | 200 | 50–800 |
| 356 KHz RF, W | 0 | 0 | 0–100 | 0 | 0 | 0–200 |

In one preferred aspect, a nitrogen-free dielectric material may be deposited in one embodiment by supplying silane to a plasma processing chamber at a flow rate between about 100 sccm and about 700 sccm, supplying TEOS to the plasma processing chamber at a flow rate of about 2000 mgm or greater, supplying helium at a flow rate between about 500 sccm and about 10,000 sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils.

The above process parameters provide a deposition rate for the nitrogen-free dielectric material in the range of about 500 Å/min to about 20,000 Å/min, such at about 2000 Å/min, when implemented on a 200 mm (millimeter) substrate in a deposition chamber available from Applied Materials, Inc., Santa Clara, Calif.

Following deposition, the deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. Annealing is preferably performed after the deposition of a subsequent layer to reduce or minimize any shrinkage or deformation of the dielectric layer that may occur during annealing. Inert gases, such as argon and helium, may be added to the annealing atmosphere.

The deposited nitrogen-free dielectric material may be plasma treated to remove contaminants or otherwise clean the exposed surface of the nitrogen-free dielectric layer prior to subsequent deposition of materials thereon. The plasma treatment may be performed in the same chamber used to deposit the nitrogen-free dielectric material. The plasma treatment generally includes providing an inert gas including helium, argon, neon, xenon, krypton, or combinations thereof, of which helium is preferred, or a reducing gas including hydrogen, ammonia, and combinations thereof, to a processing chamber. The plasma treatment may be performed between about 10 seconds and about 100 seconds. The plasma treatment is believed to clean contaminants from the exposed surface of the nitrogen-free dielectric material and may be used to stabilize the layer, such that it becomes less reactive with moisture or oxygen under atmospheric condition as well as the adhesion of layers formed thereover.

However, it should be noted that the respective parameters might be modified to perform the plasma processes in various chambers and for different substrate sizes, such as 300 mm substrates. An example of a plasma treatment for dielectric films is further disclosed in U.S. patent application Ser. No. 09/336,525, entitled, "Plasma treatment to Enhance adhesion and to Minimize Oxidation of Carbon-Containing Layers," filed on Jun. 18, 1999, and in co-pending U.S. patent application Ser. No. 10/122,106, filed on Apr. 11, 2002, entitled, "Methods for Depositing Dielectric Materials", both of which are incorporated herein by reference to the extent not inconsistent with the claimed aspects and description herein.

The deposited nitrogen-free dielectric material may have a light absorption coefficient, or extinction coefficient ($\kappa$). The $\kappa$ value represents the amount of absorption of light passing therethrough. As the $\kappa$ value increases, the amount of light absorption increases. A material having a $\kappa$ value of greater than about 0.5 has been observed to be effective for use as a hardmask and $\kappa$ values between about 0 and about 2 may be used for ARC applications depending upon the requirements for use of the ARC layer. The extinction coefficient can be varied between about 0 to about 2.0, such as between about 0 and about 1.5, for example between about 0.1 and about 1.1, at wavelengths below about 250 nm (nanometers), such as about 248 nm wavelengths or 193 nm wavelengths, making it suitable for use as an anti-reflective coating (ARC) at deep ultraviolet (DUV) wavelengths.

When the dielectric is transparent to 193 nm radiation, an absorbing ARC ($\kappa$>1, thickness>1000) may be helpful. Antireflective coating minimizes the substrate reflectivity to make a precise pattern transfer from a mask to photoresist.

The nitrogen-free dielectric material also has an index of refraction (n), which represents the refraction of the light passing therethrough, of less than about 3 at wavelengths below about 250 nm, such as at 193 nm wavelength light. Generally, n values, such between about 1.5 and about 2.2, for example, between about 1.7 and about 2.2, are acceptable for lithographic processes at wavelengths below 250 nm (nanometers) using the hardmask and ARC layer applications described herein. The n values have been observed to generally increase with the $\kappa$ value up to about a $\kappa$ value of about 0.5. The n values are then observed to generally decrease as $\kappa$ values increase above 0.5.

The extinction coefficient ($\kappa$) and the index of refraction (n) of the nitrogen-free dielectric material may be varied as a function of the composition of the gas mixture and processing parameters. It is believed that the amount of Si—H bonds in the deposited material affects the extinction coefficient ($\kappa$), and that modification of compositions and processing parameters will allow for control of the amount of Si—H bonds and the optical properties of the deposited material.

It has been observed that increasing the silicon concentration in the deposited material results in increased Si—H bonds in the deposited material and increased κ values of the deposited material. In contrast, an increase in the oxygen content of the deposited material results in a decreased κ value. Increasing the carbon concentration of the deposited material has also been observed to increase the κ value.

As the concentration of the silane-source gas is increased, i.e., the ratio of silane to TEOS increases, the amount of Si—H bonds and the extinction coefficient (κ) of the deposited material is observed to increase. For example, as the silane flow rate increases from about 50 to about sccm 225 sccm at a constant TEOS flow rate of about 500 mgm, the κ value increases from about 0.3 to about 0.9 when all other values are held constant. In another example, as the silane flow rate is increased from about 150 sccm to about 550 sccm at a constant TEOS flow rate of 2000 mgm, the κ value increases from about 0.275 to about 0.625 when all other values are held constant. Increasing the silane-based precursor flow rates has been observed to result in reducing the oxygen content of the deposited materials.

The index of refraction (n) may also be tailored by controlling the ratio of silane to TEOS. For example, a silane flow rate between about 50 sccm and about 250 sccm at a 500 mgm flow rate of TEOS can control the n value between about 1.90 and about 2.05, while a silane flow rate between about 150 sccm and about 550 sccm at a 2000 mgm flow rate of TEOS can control the n value between about 1.85 and about 1.70 respectively.

The κ values and n values may also be controlled by power levels and pressures. For example, increasing power has been generally observed to increase the oxygen content of deposited material and the κ value. Additionally, increasing deposition pressure has also been observed to result in lower κ values.

The nitrogen-free dielectric material is suitable for deposition on organic materials, such as dielectric silicon carbide or silicon oxycarbide films, or inorganic materials, such as polysilicon or metals materials including copper or barrier materials, such as tantalum. The embodiments described herein for depositing nitrogen-free dielectric material are provided to illustrate the invention and particular embodiments, and should not be used to limit the scope of the invention.

Deposition of an ARC Layer for a Dual Damascene Structure

An example of a damascene structure that is formed using the nitrogen-free dielectric material described herein as a barrier layer is shown in FIG. 1. A barrier layer 110, such as silicon carbide or oxygen-doped silicon carbide may be deposited to reduce or minimize interlayer diffusion of material. An example of a silicon carbide deposition process is described in co-pending U.S. Patent Application Publication No. 2003/008992, filed on Oct. 1, 1998, entitled, "Silicon Carbide Deposition As A Barrier Layer And An Etch Stop", and in co-pending U.S. Patent Application Publication No. 2003/0194496, filed on Apr. 11, 2002, entitled, "Methods for Depositing Dielectric Materials", both of which are incorporated herein by reference to the extent not inconsistent with the claimed aspects and description herein. The substrate surface may comprise metal features 107 formed in a dielectric material 105.

A first dielectric layer 112, typically a low k interlayer dielectric material, such as a silicon oxycarbide material (carbon doped silicon oxide) produced by oxidizing an alkylsilane in a RF energy-enhanced chemical vapor deposition process, is deposited on the oxygen-doped silicon carbide barrier layer 110 on the substrate surface including metal features 107 formed in a dielectric material 105. An example of the dielectric material for the first dielectric layer 112 and process for deposition of the dielectric material is more fully described in U.S. Pat. No. 6,287,990, issued on Sep. 11, 2001, which is incorporated by reference herein to the extent not inconsistent with the description and claims herein.

An etch stop (or second barrier layer) 114, for example, a low k silicon carbide material, is then deposited on the first dielectric layer 112. The etch stop 114 is then pattern etched to define the openings of an interconnect or contact/via 116. A second dielectric layer 118, which may have the same composition of the first dielectric layer 112 is then deposited over the patterned etch stop. A nitrogen-free ARC layer 119 as described herein is then deposited over the second dielectric layer 118. A photoresist is then deposited and patterned by conventional means known in the art to define the contacts/via 116. A single etch process is then performed to define the contact/vias 116 down to the etch stop and to etch the unprotected dielectric exposed by the patterned etch stop to define the contacts/vias 116. One or more conductive materials 120 such as copper are then deposited to fill the formed contacts/vias 116.

A preferred dual damascene structure fabricated in accordance with the invention including a nitrogen-free ARC layer deposited by the processes described herein is sequentially depicted schematically in FIGS. 2A–2H, which are cross sectional views of a substrate having the steps of the invention formed thereon.

Figure 2A:
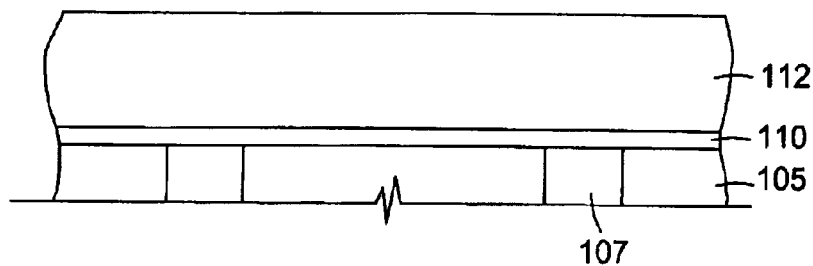
FIGS. 2A–2H are cross sectional views showing one embodiment of a dual damascene deposition sequence.

As shown in FIG. 2A, an oxygen-doped silicon carbide barrier layer 110 is deposited on the substrate surface. An example of a oxygen-doped silicon carbide deposition is as follows; introducing 1,3,5,7-tetramethylcyclotetrasiloxane (TMCTS) at about 300 mgm into the processing chamber, introducing trimethylsilane (TMS) at about 360 mgm into the processing chamber, introducing helium at about 1000 sccm into the processing chamber, generating a plasma in the processing chamber by applying 950 watts of RF energy, maintaining the substrate temperature at about 350° C., maintaining the chamber pressure at about between about 8.7 Torr to deposit an oxygen-doped silicon carbide layer. The spacing between the gas distributor and the substrate surface is about 515 mils. The above provided example is merely illustrative and should not be construed or interpreted as limiting the scope of the invention.

Further examples of depositing oxygen-doped silicon carbide material are more fully described in U.S. Patent Application Publication No. 2003/0113995, filed on Mar. 12, 2002, entitled, "Method for Depositing a Low K Dielectric Film for Hardmask Application," which is incorporated herein by reference to the extent not inconsistent with the claimed aspects and description herein. While not shown, a capping layer of nitrogen-free silicon carbide may be deposited on the barrier layer 110. The nitrogen-free silicon carbide capping layer may be deposited in situ.

The oxygen-doped silicon carbide barrier layer 110 may be plasma treated with an inert gas including helium (He), argon (Ar), neon (Ne), and combinations thereof, and/or a reducing gas including hydrogen, ammonia, and combinations thereof. The plasma treatment may be performed in situ with the deposition of the oxygen-doped silicon carbide material.

A first dielectric layer 112 of interlayer dielectric material, such as a silicon oxycarbide, is deposited on the first oxygen-doped silicon carbide barrier layer 110 to a thickness of about 5,000 to about 15,000 Å, depending on the size of the structure to be fabricated. Example of a low dielectric constant material that may be used as an interlayer dielectric material is Black Diamond™ commercially available from Applied Materials, Inc., of Santa Clara, Calif. The first dielectric layer my also comprise other low k dielectric materials including a low polymer material, such as paralyne, or a low k spin-on glass such as un-doped silicon glass (USG) or fluorine-doped silicon glass (FSG).

The first dielectric layer 112 may then be treated by a plasma process to remove contaminants and densify the surface of the dielectric layer 122. An example of a plasma process includes introducing a processing gas containing helium or a reducing gas, such as hydrogen, between about 500 sccm and about 1,500 sccm, at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process.

Figure 2B:
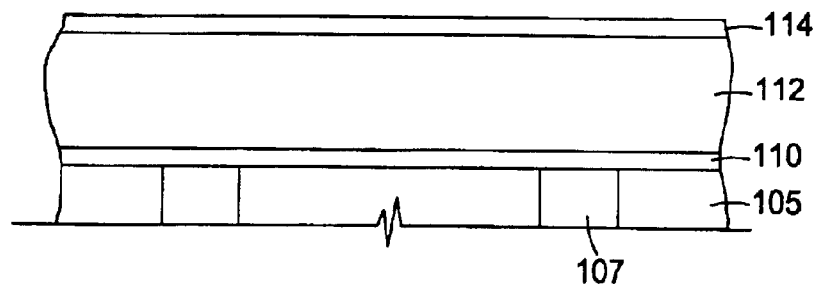
Figure 2C:
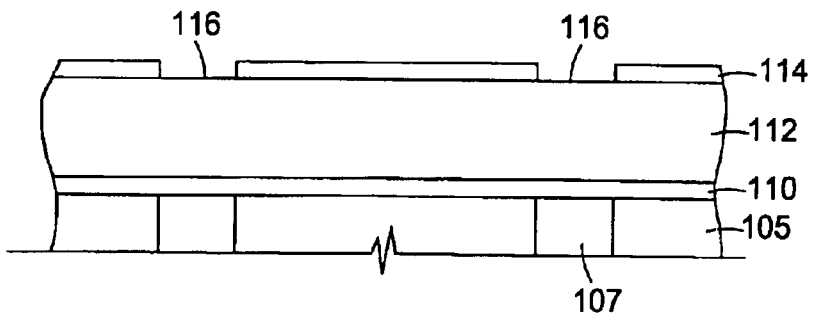

As shown in FIG. 2B, the low k etch stop 114, which may be a silicon carbide material, is then deposited on the first dielectric layer to a thickness of about 200 to about 1000 Å. The low k etch stop 114 may be plasma treated as described herein for the oxygen-doped silicon carbide barrier layer 110. The low k etch stop 114 is then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 116 prior to depositing further materials.

Figure 2D:
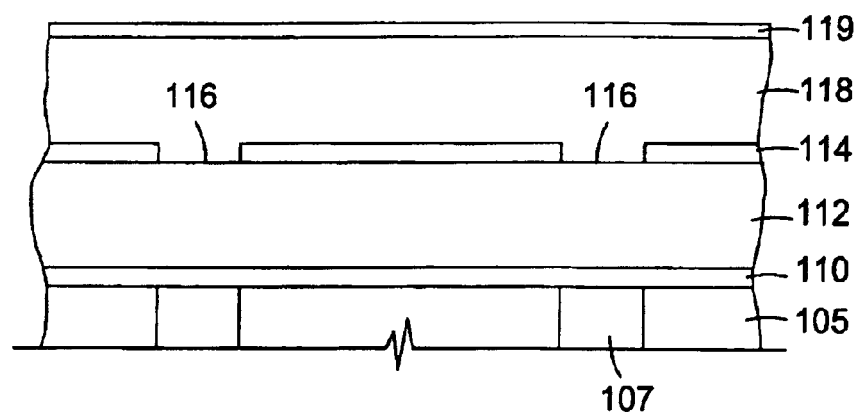

After low k etch stop 114 has been etched to pattern the contacts/vias and the photoresist has been removed, a second dielectric layer 118 of silicon oxycarbide is deposited to a thickness of about 5,000 to about 15,000 Å and a nitrogen-free ARC layer 119 is deposited thereon as shown in FIG. 2D. The second dielectric layer 118 may be plasma treated as described herein for the first dielectric layer 112 prior to depositing the nitrogen-free ARC layer 119. The plasma treatment is believed to reduce the reactivity of the surface of the layer 118 to subsequently deposited materials.

The nitrogen-free ARC layer 119 may be deposited as described herein on the second dielectric layer 118. For example, the ARC layer 110 may be deposited by supplying silane to a plasma processing chamber at a flow rate between about 100 sccm and about 700 sccm, supplying TEOS to the plasma processing chamber at a flow rate of about 2000 mgm or greater, supplying helium at a flow rate between about 500 sccm and about 10,000 sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils.

In an alternative embodiment, a nitrogen-free silicon carbide or silicon oxide cap layer between about 100 Å and about 500 Å thick may be deposited on second dielectric layer 118 prior to depositing additional materials, such as the ARC layer 119.

Figure 2E:
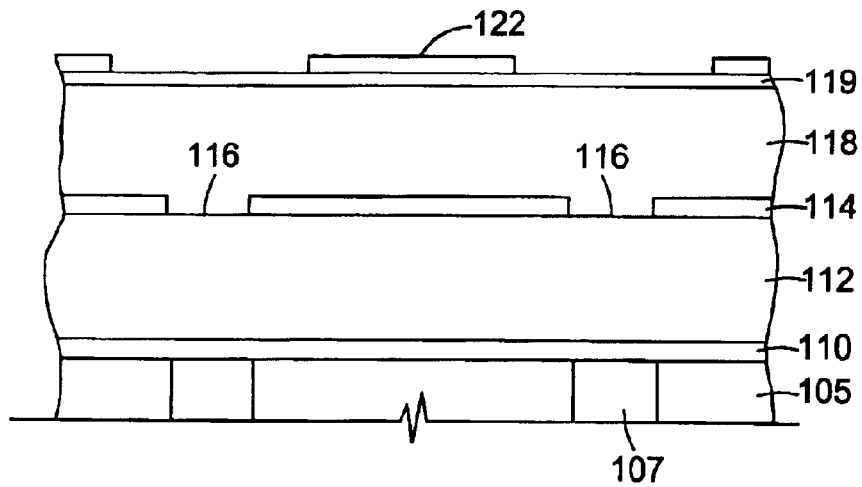
Figure 2F:
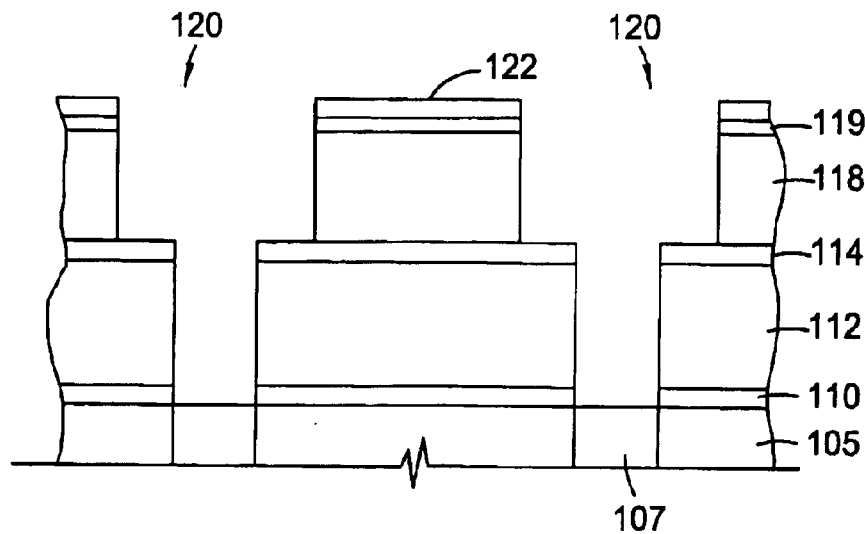

A photoresist material 122 is then deposited on the nitrogen-free ARC layer 119 and patterned preferably using conventional photolithography processes to define the interconnect lines 120 as shown in FIG. 2E. The photoresist material 122 comprises a material conventionally known in the art, preferably a high activation energy photoresist, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any photoresist or other material used to pattern the etch stop 114 or the second dielectric layer 118 is removed using an oxygen strip or other suitable process.

Figure 2G:
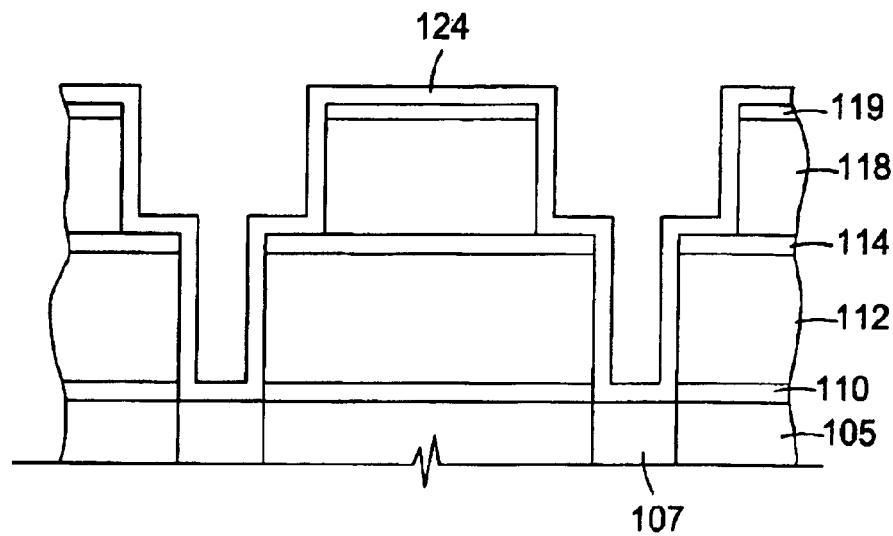
Figure 2H:
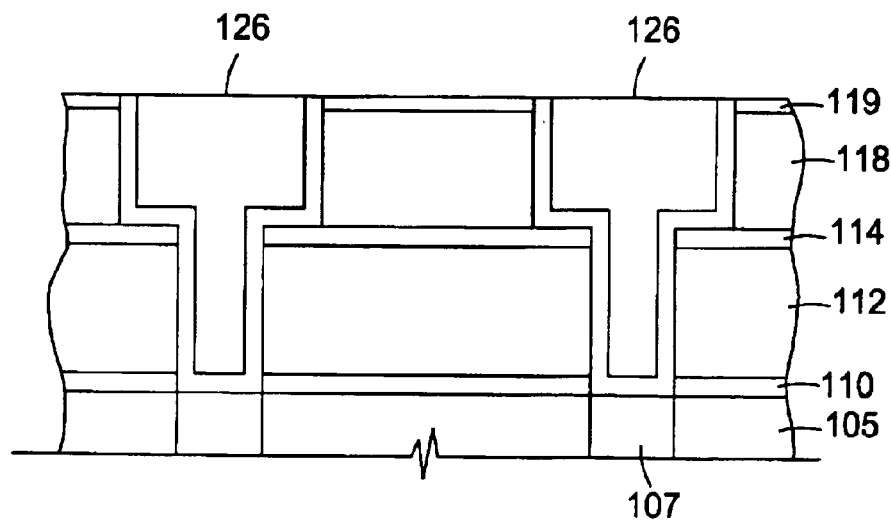

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2G, a suitable barrier layer 124 such as tantalum nitride is first deposited conformally in the metallization pattern to prevent copper migration into the surrounding silicon or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2H.

The deposition of the nitrogen-free dielectric materials as the anti-reflective coating was observed to eliminate any adverse interactions between the $NH_2$ amine group from nitrogen containing dielectric materials and the DUV 193 nm photoresist that is directly in contact with the anti-reflective coating (ARC), and thus, eliminate major source of photoresist poisoning-induced footing. The nitrogen-free dielectric ARC demonstrated a wide tunable range of its optical properties at 193 nm in a single wafer PECVD reactor: 1.6<n<1.9 and 0<K<1.1. This range enables cost-effective and in-situ deposition of a dual-layer dielectric ARC on the low k dielectric layers during the dual damascene process. Nitrogen-free dielectric ARC can be integrated with low k dielectrics and has sufficient adhesion with low k materials as well as the ability to be etched and chemically and mechanically polished together with low k dielectrics.

Deposition of a Dual Damascene Structure

In an alternative embodiment of the damascene structure, the nitrogen-free dielectric material described herein may be deposited as a hardmask layer over a dielectric layer prior to depositing the photoresist material for improving damascene formation and protecting the low k material of the damascene structure when etching the metallization structure. An example of a damascene structure that is formed using a nitrogen-free dielectric material as a hardmask described herein is shown in FIGS. 3A–G, which are cross sectional views of a substrate having the steps of the invention formed thereon.

Figure 3A:
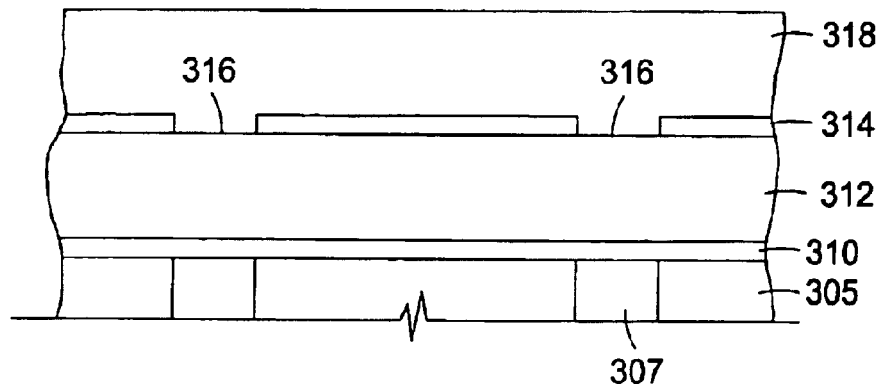
FIGS. 3A–3G are cross sectional views showing one embodiment of a dual damascene deposition sequence.

As shown in FIG. 3A, a barrier layer 310, such as silicon carbide, is deposited on the substrate surface to eliminate inter-level diffusion between the substrate and subsequently deposited material. The substrate surface may comprise feature definitions 307 formed in a dielectric material 305. The barrier layer 310 may be doped with oxygen, boron, phosphorus, or combinations thereof.

A first dielectric layer 312, which may comprise a silicon oxycarbide material is deposited on the barrier layer 310 on the substrate surface and in feature definitions 307 formed in a dielectric material 305. The first dielectric layer 312 of interlayer dielectric material is deposited on the barrier layer 310 by oxidizing an organosilane or organosiloxane, such as trimethylsilane, to a thickness of about 5,000 to about 15,000 Å, depending on the size of the structure to be fabricated.

Examples of a low dielectric constant material that may be used as an interlayer dielectric material is Black Diamond™ commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). A plasma process following deposition as described herein for the silicon oxycarbide layer may then treat the first dielectric layer 312.

A low k etch stop (or second barrier layer) 314, such as a silicon carbide material or oxidized organosilane layer, is then deposited on the first dielectric layer 312 to a thickness of about 200 to about 1000 Å. The low k etch stop 314 is then pattern etched to define the contact/via openings 316 and to expose first dielectric layer 312 in the areas where the contacts/vias are to be formed as shown in FIG. 3A. Preferably, the low k etch stop 314 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 316 prior to depositing further materials.

After the low k etch stop 314 has been etched to pattern the contacts/vias and the photoresist has been removed, a second dielectric layer 318, such as silicon oxycarbide, is deposited to a thickness of about 5,000 to about 15,000 Å as shown in FIG. 3A. The second dielectric layer 318 may also be plasma treated as described herein.

Figure 3B:
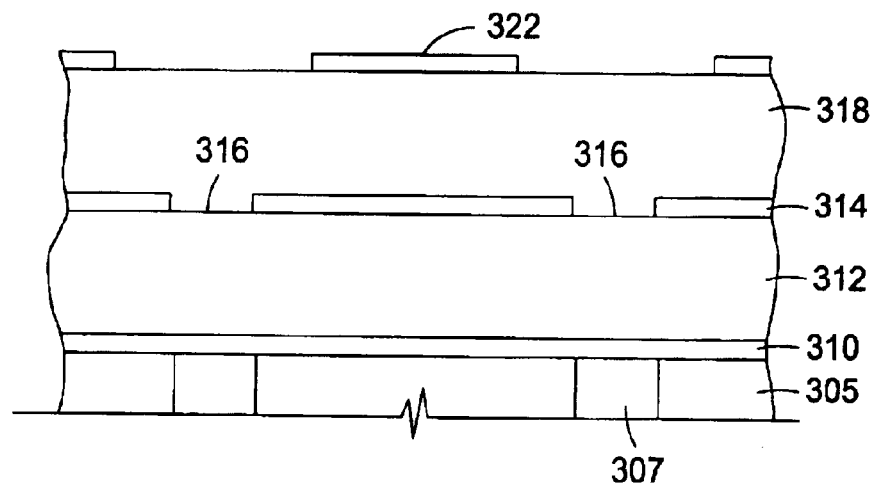

A nitrogen-free dielectric hardmask layer 322 as described herein may then be deposited on the second dielectric layer 318 and patterned preferably using conventional photolithography processes to define the interconnect lines 320 as shown in FIG. 3B. The nitrogen-free dielectric hardmask layer 322 is a hardmask which may perform as a stop for chemical mechanical polishing techniques to allow removal of conductive material while protecting low k dielectric materials, such as the second dielectric layer 318, from damage during etching processes or from polishing processes, such as chemical-mechanical polishing. The hardmask layer 322 of the nitrogen-free dielectric material described herein has exhibited an etching selectivity of oxide or metal to hardmask of about 4:1 or greater, and in some instances has exhibited an etching selectivity of about 10:1 or greater of oxide or metal to hardmask.

The nitrogen-free dielectric hardmask layer 322 is deposited as described herein. An example of a hardmask deposition includes supplying silane to a plasma processing chamber at a flow rate between about 100 sccm and about 700 sccm, supplying TEOS to the plasma processing chamber at a flow rate of about 2000 mgm or greater, supplying helium at a flow rate between about 500 sccm and about 10,000 sccm, maintaining a substrate temperature between about 250° C. and about 450° C., maintaining a chamber pressure between about 3 Torr and about 10 Torr, supplying an RF power of between about 100 watts and about 1000 watts for a 200 mm substrate, and spacing the substrate from the source of processing gas at a distance between about 300 mils and about 500 mils. The hardmask 322 is deposited at a deposition rate of about 2000 Å/min. The hardmask 322 was observed to have an etch selectivity of oxide or metal to hardmask of about 10:1.

Figure 3C:
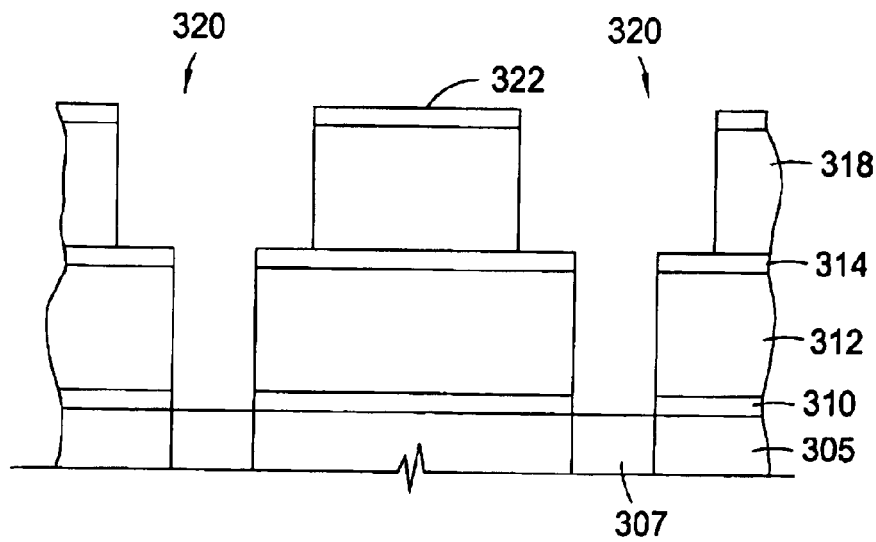

The features are then etched through to the second dielectric layer 318, the low k etch stop 314, the first dielectric layer 312, and the silicon carbide barrier layer 310 as shown in FIG. 3C. The hardmask 322 may be completely removed by the etch process.

Figure 3D:
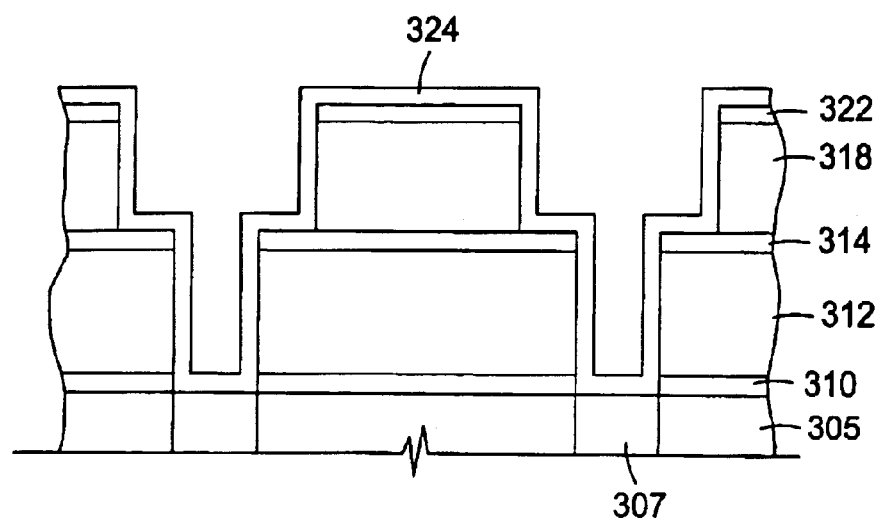
Figure 3E:
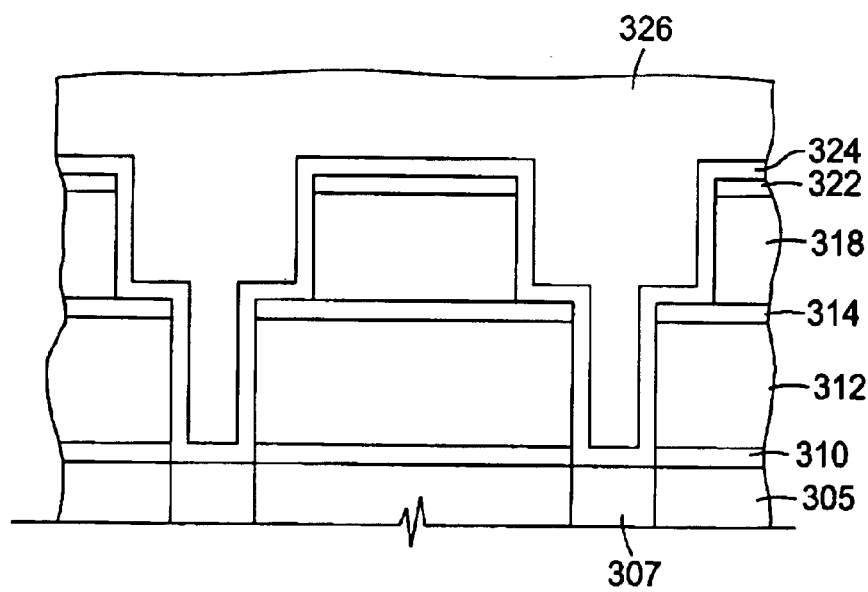

The interconnect lines 320 are then filled to form a metallization structure with a conductive material such as aluminum, copper, tungsten or combinations thereof. Presently, the trend is to use copper to form the smaller features due to the low resistivity of copper (1.7 $\mu\Omega$-cm compared to 3.1 $\mu\Omega$-cm for aluminum). Preferably, as shown in FIG. 3D, a suitable barrier layer 324 such as tantalum or tantalum nitride is first deposited conformally in the metallization pattern to prevent copper migration into the surrounding silicon or dielectric material. Thereafter, copper 326 is deposited using electrochemical deposition, such as electroplating or electroless deposition, chemical vapor deposition, physical vapor deposition, or combinations thereof, to fill the structure as shown in FIG. 3E.

Figure 3F:
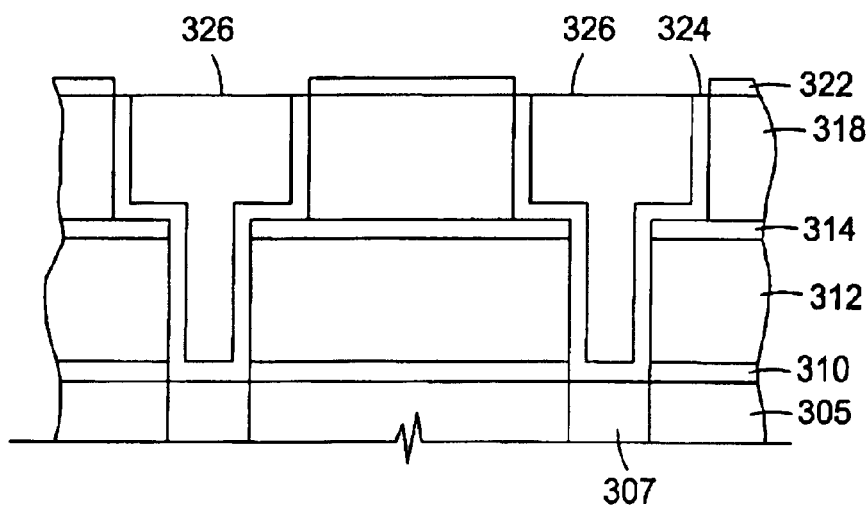
Figure 3G:
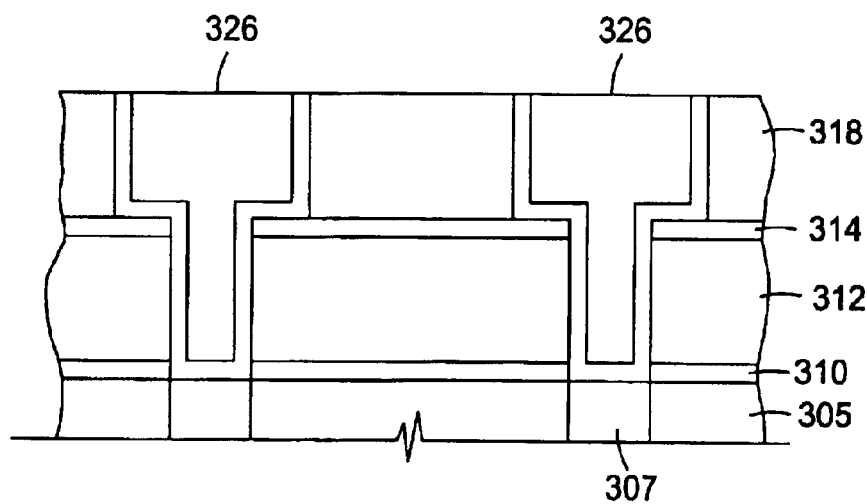

Once the structure has been filled with copper or other metal, the surface is planarized using chemical mechanical polishing. However, the polishing resistant nitrogen-free dielectric hardmask layer 322 may remain behind after the polishing process as shown in FIG. 3F. The nitrogen-free dielectric hardmask layer 322 may be removed by a plasma process from the surface of the substrate.

Deposition of a Dual ARC Layer

Figure 4:
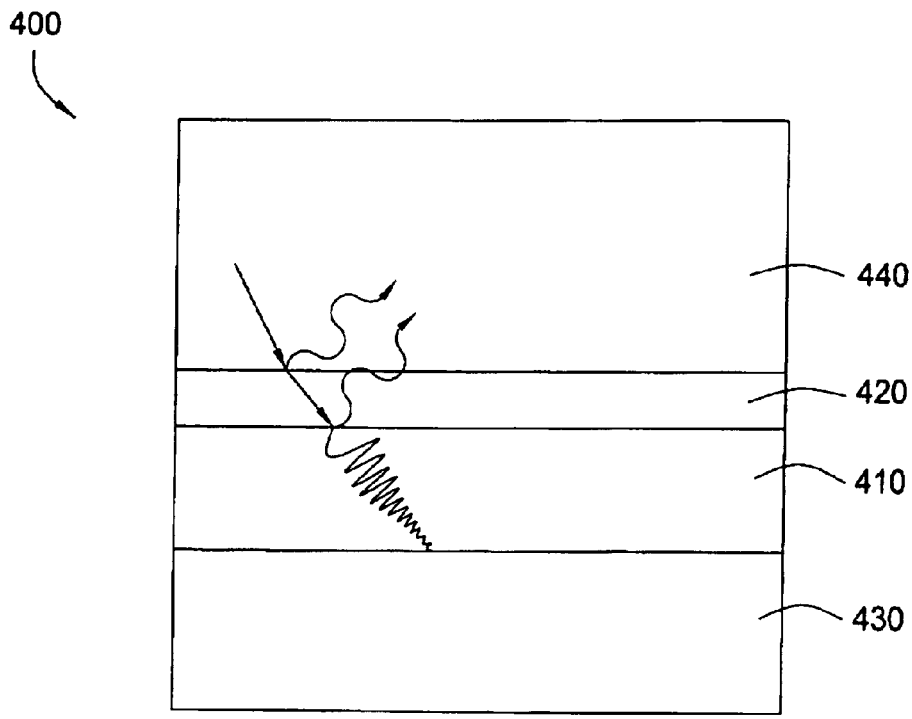
FIG. 4 is a schematic diagram of a dual layer antireflective coating indicating light reflection.

The nitrogen-free dielectric ARC layer described herein may be deposited as a dual layer (bilayer) prior to depositing and patterning of a photoresist thereon. Referring to FIG. 4, in the dual layer format 400, a bottom absorption layer 410 with a high index on infraction (n) and a high extinction coefficient (K) is provided to act as a reflector as well as absorber while thickness and optical properties of a top phase-shift layer (low k layer) 420 are engineered to cancel the reflected light from the resist 440/top layer 420 interface and top layer (low k) 420/bottom layer (high k) 410 interface. The dual layers 410, 420 are deposited on a low k material, such as a carbon-doped silicon oxide as described herein. A photoresist material 440 is then deposited on the top layer prior to photolithography.

The top layer 420 and bottom layers 410 may be deposited in situ and from the same precursors in the chamber. The nitrogen-free dielectric deposition herein may have processing parameters varied, such as temperature, pressure, relative amounts or ratio of precursors to provide independent optical properties for the top layer 420 and bottom layers 410. The dual layer coating 400 is typically designed to provide a substrate reflectivity below 1 percentage across the wafer, which minimizes CD swing. Alternatively, only the top layer 420 or bottom layer 410 may comprise the nitrogen free dielectric ARC material described herein, with the other layer comprising a conventional ARC material.

Deposition Examples

The following examples illustrate deposition of the materials described herein for ARC and hardmask applications. The materials were deposited using a chemical vapor deposition chamber that is part of an integrated processing platform. In particular, the films were deposited using a Producer™ deposition system commercially available from Applied Materials, Inc. of Santa Clara, Calif.

A nitrogen-free ARC layer was deposited by a mixed precursor process on a 200 mm substrate from the following reactive gases at a chamber pressure of about 5 Torr and substrate temperature of about 400° C.

Silane (SiH$_4$), at about 400 sccm;

Tetraethoxysilane (TEOS), at about 2000 mgm; and

Helium, at about 2,000 sccm;

The substrate was positioned about 400 mils from the gas distribution showerhead. A plasma was generated by applying a power level of about 500 W at a frequency of 13.56 MHz to the showerhead. The film was deposited at a rate of about 3168 Å/min for about 10 seconds for a deposition thickness of about 528Å. The deposited film was tested and optical properties of an absorption coefficient (κ) of about 0.369 and a n value of 1.776 for a 193 nm wavelength was observed.

A nitrogen-free hardmask layer was deposited by a mixed precursor process on a 200 mm substrate from the following reactive gases at a chamber pressure of about 5 Torr and substrate temperature of about 400° C.

Silane (SiH$_4$), at about 375 sccm;

Tetraethoxysilane (TEOS), at about 1000 mgm; and

Helium, at about 2,000 sccm;

The substrate was positioned about 400 mils from the gas distribution showerhead. A plasma was generated by applying a power level of about 500 W at a frequency of 13.56 MHz to the showerhead. The film was deposited at a rate of about 3898 Å/min for about 10 seconds for a deposition thickness of about 650 Å. The deposited film was tested and optical properties of an absorption coefficient (κ) of about 1.017 and a n value of 1.774 for a 193 nm wavelength was observed.

Dual Layer Coating Examples

Sample nitrogen-free dielectric anti-reflective coatings were deposited in a parallel plate plasma-enhanced chemical vapor deposition (PECVD) at T=350° C. using silane (SiH$_4$) and an nitrogen-free oxidizer. A Thermawave Optiprobe, model-5340 was used to measure thickness, n and κ values at λ=193 nm. Process parameters such as high frequency power, pressure, gas ratio and susceptor spacing were varied to explore the tunable range of optical properties. A Prolith reflectivity simulator, which can calculate the substrate reflectivity as a function of up to two variables of an ARC film for a given film stack with known optical properties and thickness, was used to find sets of optimal n, κ, and thickness for minimum substrate reflectivity given a film stack. The composition of the nitrogen-free dielectric anti-reflective films was analyzed by Rutherford Back Scattering method (RBS), Hydrogen Forward Scattering (HFS), and Nuclear Reaction Analysis (NRA). A Bio-Rad FTIR Model QS-312 was used to study chemical bonding of the deposited layers. The nitrogen free dielectric coating with a low κ dielectric SiOCH was tested using m-ELT by depositing 500 Å–800 Å of nitrogen-free dielectric ARC on 5 kÅ of SiOCH. The nitrogen-free dielectric ARC was etched in e-Max™ chamber, Applied Materials' dielectric etcher, with CF$_4$ chemistry that is used for silicon oxycarbide or carbon-doped silicon oxide (SiOCH) trench etch and chemically-mechanically polished in a CMP chamber.

The nitrogen-free precursors in PECVD processing ensured that the anti-reflective coating did not have nitrogen, as confirmed by RBS/HFS/NRA. No photoresist poisoning was observed, indicating that the NH$_2$ amine group in ARC is minimized or eliminated.

Figure 5:
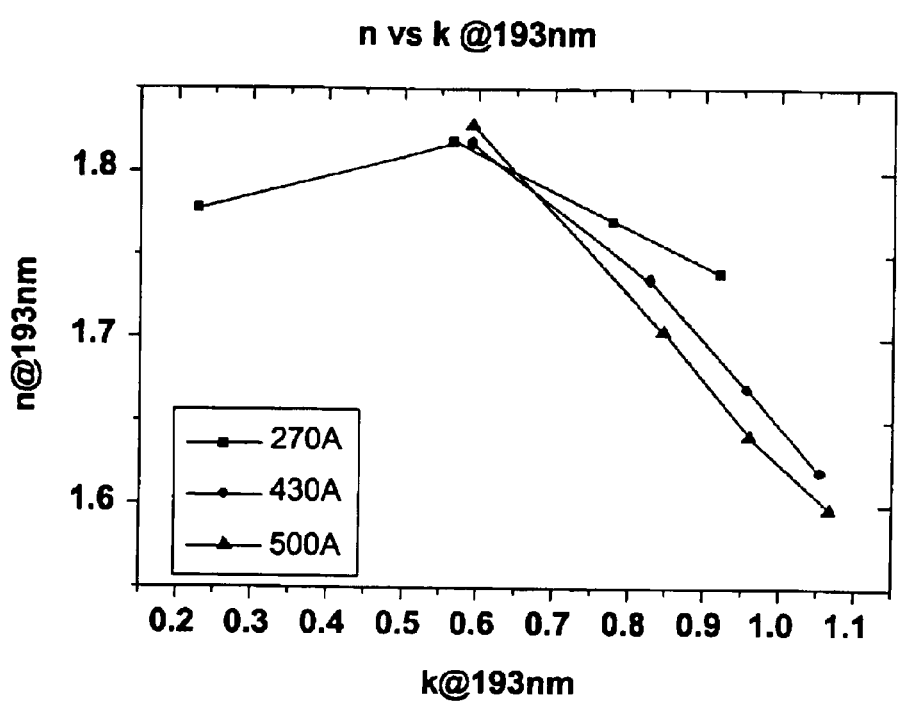
FIG. 5 is a chart indicating the relationship between the gas flow ratio of $SiH_4$/N-free and extinction coefficient.

Referring to FIG. 5, the n and κ of the nitrogen free dielectric ARC have ranges wide enough to cover a dual-layer ARC, minimizing reflectivity below 1 percentage.

Among the process knobs available in a PECVD reactor, gas flow ratio of SiH$_4$/nitrogen free oxidizer is the simplest parameter to vary n and κ. As more SiH$_4$ flows, κ consistently increases. Interestingly, it was observed that although initially the n increases, it actually then decreases as κ increases beyond 0.6 (see FIG. 5). According to RBS/HFS analysis, silicon atom (Si) content and hydrogen atom (H) content increase together with κ value and additionally, the Si—H absorption signal increases according to FTIR spectra, confirming that Si—H bonds are responsible for absorption at DUV wavelengths.

For 90 nm dual damascene processes, barrier materials and low k IMD are deposited, and patterned with via and trench etch prior to feature fill with a barrier layer and copper electroplating. The optimal sets of n, κ, and thickness for dual layers were obtained using a Prolith simulator for the low k IMD/barrier stack.

A set of exemplary reflectivity contour maps were used to test the film. One of the possible sets of results has a top layer having an index of refraction of n=1.78±0.1, an extinction coefficient of κ =0.3±0.05, and a thickness of t=250±50 Å, and a bottom layer of having an index of refraction of n=1.75±0.1, an extinction coefficient of κ =1.0±0.1, and a thickness of t=400±100 Å. Other optimal sets of n, κ, and thickness values for a top layer and a very wide window for a bottom layer have been observed. The dual-layer scheme offers a much wider n, κ, and thickness window, providing lower reflectivity than a single layer. These optimal n and κ windows fall within the tuning range of the nitrogen-free dielectric ARC, allowing a flexible integration scheme. In our single wafer PECVD reactor, a low κ top layer can be continuously deposited in-situ following the high κ bottom layer without transferring the wafer from the chamber. The dual-layer nitrogen-free dielectric ARC can thus be readily deposited while maintaining high throughput.

In dual damascene application, photoresist material may be removed from the ARC coating, typically by an oxygen-based process known as O$_2$-ashing, which may be a plasma-based process. The nitrogen-free ARC coating is subjected to repeated photoresist deposition and O$_2$-ashing during dual damascene formation and the stability of the film, i.e., retention of optical properties of the ARC layer, needs to be retained under such conditions. A nitrogen-free capping layer, such as an oxide, is deposited on the nitrogen-free ARC coating prior to deposition, patterning, and ashing of a photoresist material by O$_2$ plasma. The capping layer may be deposited to between about 50 Å and about 100 Å to protect the nitrogen-free dielectric ARC to retain the ARC layer's optical properties. Film stability may also be improved for low κ nitrogen-free dielectric ARC by a nitrogen-free oxidizing plasma treatment after deposition.

Interlayer adhesion between the nitrogen-free dielectric ARC and low k IMD films, such as SiOCH, was tested by m-ELT and found to be equivalent to that of a standard SiON dielectric ARC with SiOCH at the same thickness. The nitrogen-free dielectric ARC K$_{app}$ was greater than 0.252 MPa-m$^{1/2}$. The nitrogen-free dielectric ARC had similar etching properties to that of the dielectric materials, with the same etch chemistry, as the low k IMD via/trench. We measured the etch rate of the N-free dielectric ARC by SiOCH trench etch CF$_4$ chemistry in the e-Max™, etch chamber. The measured etch rate of the nitrogen-free dielectric ARC by SiOCH trench etch CF$_4$ chemistry in the e-Max™ etch chamber was at least 20 percentage faster than SiOCH (see Table 2). Additionally, the N-free dielectric ARC has a polishing material removal rate comparable to FSG and expected to be faster than that of SiOCH, which has a degree of porosity.

TABLE 2

|  | SiOCH | N-free low κ | N-free high κ | SiON | FSG |
|---|---|---|---|---|---|
| Etch Rate(Å/m) | 1 | 1.2 | 1.5 |  |  |
| Polish rate(Å/m) |  | 1.0 | 1.3 | 1.1 | 1 |

Figure 6:
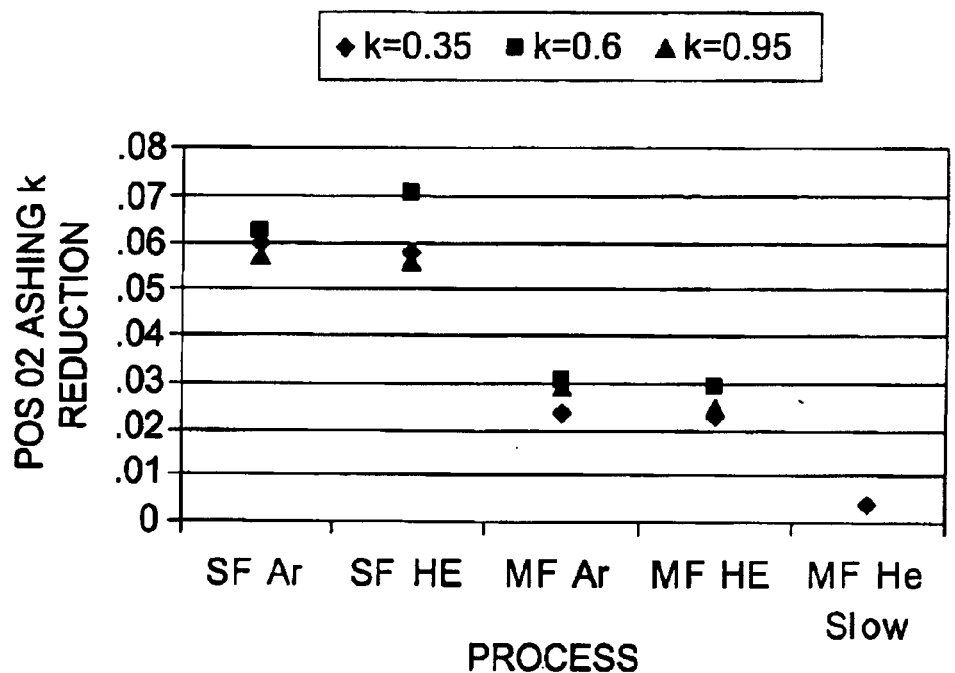
FIG. 6 shows the results of post oxygen ashing extinction coefficient reduction as a function of process conditions.
Figure 7:
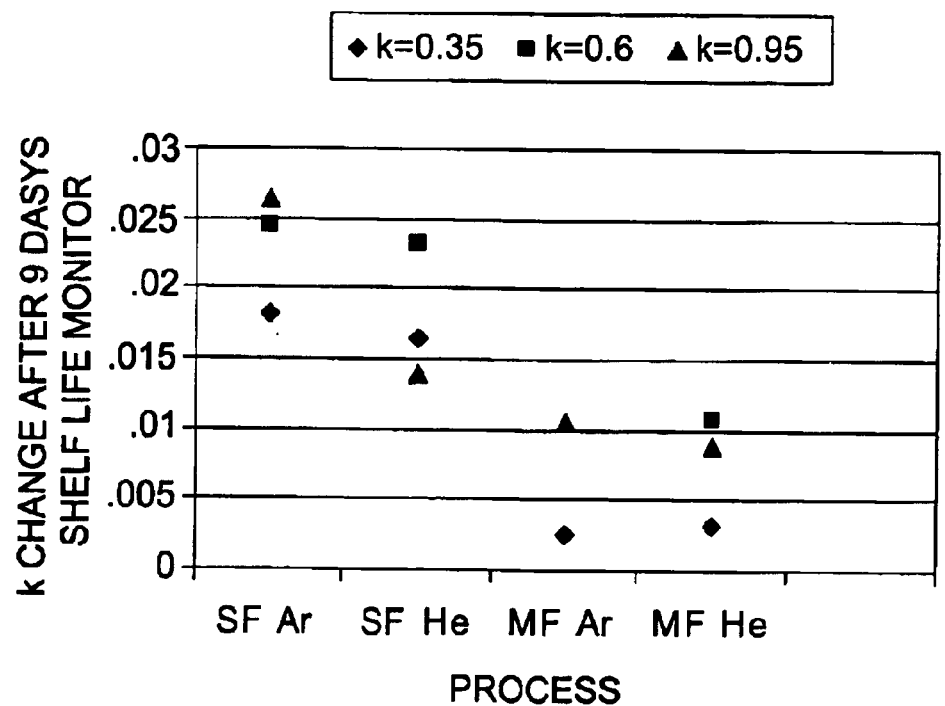
FIG. 7 shows the extinction coefficient change after 9 day shelf life monitoring.

FIGS. 6 and 7 illustrate how using a mixture of high and low frequencies produces film layers with better resistance to oxygen ashing and water absorption. FIG. 6 shows the results of post oxygen ashing extinction coefficient reduction as a function of different processes for three different extinction coefficient films. Similarly, FIG. 7 shows the extinction coefficient change after nine day shelf life monitoring. The processes include single high frequency with argon, single high frequency with helium, mixed high and low frequency with argon, mixed high and low frequency with helium and mixed high and low frequency with slow deposition rate. High frequency is 13.56 MHz and low frequency is less than 1 MHz. Mixed frequency plasma is exposure to both frequencies.

Figure 8:
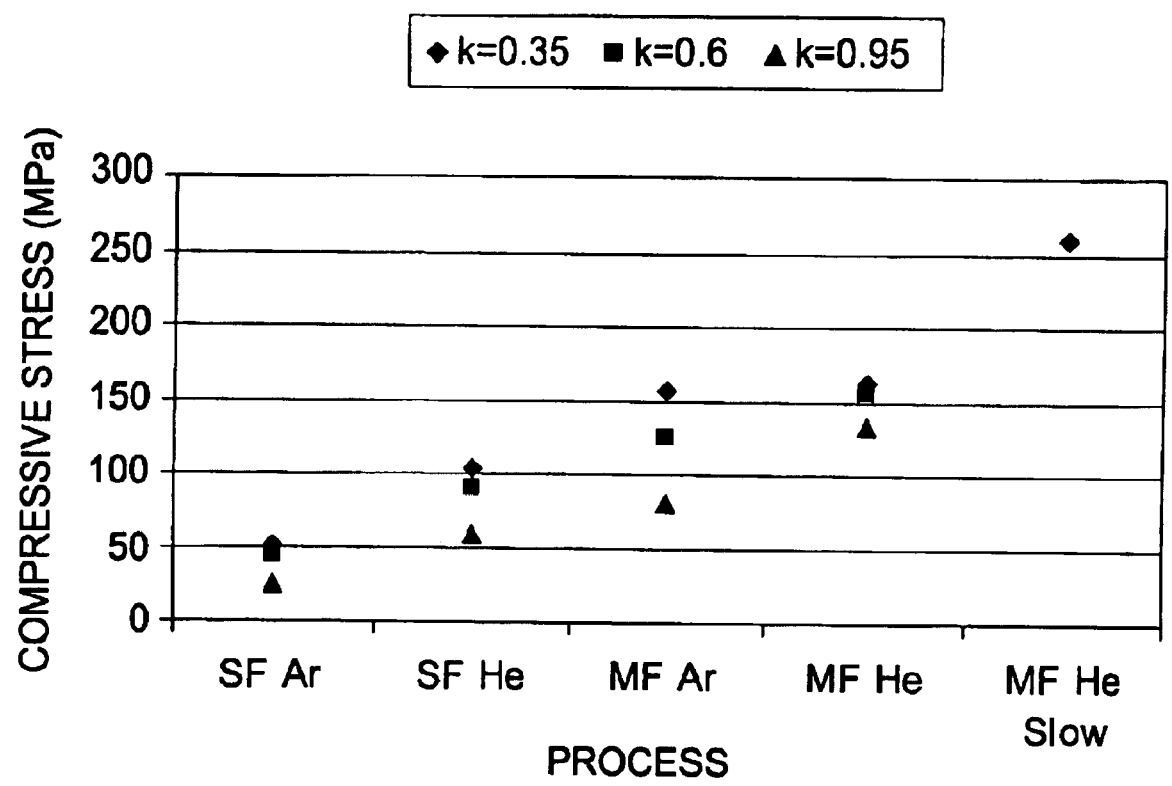
FIG. 8 shows compressive stress as a function of process conditions.

FIG. 8 shows the results of compressive stress testing as a function of the different processes for three different extinction coefficient films. These results illustrate how using helium as a carrier gas results in higher compressive stress values. The mixed high and low frequency plasma had higher compressive stress results. The lowest extinction coefficient films have higher compressive stress results than the higher extinction coefficient films.

Chart 3 summarizes the results of the cross-sectional SEM (XSEM) on 193 nm PR on dielectric antireflective coating.

| Recipe | Stress MPa | FTIR Si-OH at 3650 cm −1 7 days in air | Lithography 85/85 | Top Down |
|---|---|---|---|---|
| SION |  | No | No | scums/footing |
| SF AR LK | −50 | Yes | Yes | not good |
| SF HE LK | −104 | Yes | Yes | not good |
| ME AR LK | −156 | No | No | not good |
| ME HE LK | −162 | No | No | good |
| MFHE Slow | −258 | No | No | good |
| SF AR MK | −43 | Little | Little | not good |
| SF HE MK | −89 | Little | Little | not good |
| MF AR MK | −125 | No | No | not good |
| MF HE MK | −154 | No | No | not good |
| SF AR HK | −26 | Very Little | Very Little | not good |
| SF HE HK | −59 | Very Little | Very Little | not good |
| ME AR HK | −81 | No | No | good |
| MF HE HK | −132 | No | No | good |

Chart 3. Summary of film property stress, FTIR, and lithography test results.

Another way to make nitrogen free dielectric anti-reflective coating free of basic radicals is to coat the anti-reflective coating. Scanning electron microscope testing of an amorphous silicon treated antireflective coating revealed no observable footing.

While the foregoing is directed to preferred embodiments of the present invention, other and further embodiments of the invention may be devised without departing from the basic scope thereof, and the scope thereof is determined by the claims that follow.

What is claimed is:

1. A method for processing a substrate, comprising:

depositing a first anti-reflective layer; and depositing a second anti-reflective layer on the first anti-reflective layer by a process comprising:

introducing a processing gas comprising a compound comprising an oxygen-free silane-based compound and an oxygen and carbon containing compound to the processing chamber; and reacting the processing gas to deposit a nitrogen-free dielectric material on the substrate, wherein the nitrogen-free dielectric material comprises at least silicon and oxygen.

2. The method of claim 1, wherein the oxygen-free silane-based compound comprises one or more compounds having the formula $Si_XH_{2X+2}$, $Si_XH_YCl_Z$, $(R)_ZSi_XH_Y$, or combinations thereof, wherein X is 1 to 4, Y is 0 to 2X+1, Z is 2X+2, and R is an organic group.

3. The method of claim 1, wherein the oxygen and carbon containing compound is an organosilicon selected from the group of tetraethoxysilane (TEOS), triethoxyfluorosilane (TEFS), 1,3,5,7-tetramethylcyclotetrasiloxane (TMCTS), dimethyldiethoxysilane, and combinations thereof.

4. The method of claim 3, wherein the ratio of the oxygen-free silane-based compound to the oxygen-containing organosilicon compound is between about 1 sccm:20 mgm and about 6 sccm:5 mgm.

5. The method of claim 1, wherein the second anti-reflective layer comprises silicon, oxygen, and carbon, and has an oxygen content between about 15 atomic percentage and about 50 atomic percentage of oxygen.

6. The method of claim 1, wherein the processing gas further comprises an inert gas selected from the group of argon, helium, neon, xenon, or krypton, and combinations thereof.

7. The method of claim 1, wherein the reacting the processing gas comprises generating a plasma at a RF power level between about 50 watts and about 10,000 watts at a pressure between about 1 Torr and about 50 Torr and a substrate temperature between about 100° C. and about 1000° C.

8. The method of claim 1, wherein the first anti-reflective layer is depositing by introducing a second processing gas comprising a compound comprising an oxygen-free silane-based compound and an oxygen and carbon containing compound to the processing chamber and reacting the second processing gas to deposit a nitrogen-free dielectric material on the substrate comprising at least silicon and oxygen.

9. The method of claim 1, further comprising an oxide capping layer disposed on the second anti-reflective coating.

10. The method of claim 1, further comprising exposing the second anti-reflective coating to a nitrogen-free oxidizing plasma.

11. The method of claim 1, wherein the first anti-reflective coating and the second anti-reflective coating have a combined reflectivity below 1 percentage.

12. The method of claim 1, further comprising:

depositing a photoresist material on the anti-reflective coating; and patterning the photoresist layer.

13. The method of claim 12, further comprising:

etching the second anti-reflective coating and any underlying dielectric material to define an interconnect opening therethrough; and depositing one or more conductive materials to fill the interconnect opening.

14. The method of claim 1, wherein the oxygen and carbon containing compound is carbon dioxide.

15. The method of claim 1, wherein the first antireflective coating has an extinction coefficient that is higher than the extinction coefficient for the second antireflective coating.

16. The method of claim 1, wherein the processing gas further comprises an inert gas selected from the group of argon, helium, neon, xenon, or krypton, and combinations thereof.

17. The method of claim 1, wherein the deposited nitrogen-free dielectric material has an index of refraction between about 1.5 and about 2.2.

18. The method of claim 1, wherein the deposited nitrogen-free dielectric material has an extinction coefficient of between about 0 and about 2.

19. The method of claim 7, wherein the reacting the processing gas comprises generating a plasma at a RF power level between about 50 watts and about 10,000 watts at a pressure between about 1 Torr and about 50 Torr and a substrate temperature between about 100° C. and about 1000° C.

20. The method of claim 1, wherein the first anti-reflective coating and the second anti-reflective coating have an etch selectivity of oxide to anti-reflective coating of about 4:1 or greater.

* * * * *

UNITED STATES PATENT AND TRADEMARK OFFICE
CERTIFICATE OF CORRECTION

| | |
|---|---|
| PATENT NO. | : 6,927,178 B2 |
| APPLICATION NO. | : 10/732904 |
| DATED | : August 9, 2005 |
| INVENTOR(S) | : Bok Hoen Kim et al. |

It is certified that error appears in the above-identified patent and that said Letters Patent is hereby corrected as shown below:

In the Specification

Column 14, Line 13: Change "$\mu$l-cm" to --$\mu\Omega$-cm--

Column 17, Line 4 of Chart 3: Change "ME AR LK" to --MF AR LK--

Column 17, Line 5 of Chart 3: Change "ME HE LK" to --MF HE LK--

Column 17, Line 13 of Chart 3: Change "ME AR HK" to --MF AR HK--

Signed and Sealed this

First Day of August, 2006

JON W. DUDAS
*Director of the United States Patent and Trademark Office*